United States Patent [19]

d'Humieres et al.

[11] Patent Number: 4,712,001

[45] Date of Patent: Dec. 8, 1987

[54] TRANSIENT ANALYSIS SYSTEM USING A PHOTONIC SAMPLER DEVICE

[75] Inventors: Etienne d'Humieres, Versailles; Jean M. Bernet, La Celle St. Cloud; Claude Imhoff, St. Germain en Laye, all of France

[73] Assignee: Thomson CSF, Paris, France

[21] Appl. No.: 808,032

[22] Filed: Dec. 12, 1985

[30] Foreign Application Priority Data

Dec. 14, 1984 [FR] France .................. 84 19196

[51] Int. Cl.$^4$ .............................. H01J 31/50
[52] U.S. Cl. ...................... 250/213 VT; 313/525
[58] Field of Search ............ 250/213 VT, 213 R, 207; 313/528, 524, 525, 527, 530, 532, 543, 103 CM, 105 CM, 529

[56] References Cited

U.S. PATENT DOCUMENTS 3,683,185 8/1972 Muehllehner .............. 250/213 VT
3,805,058 4/1974 Glaenzer ...................... 313/527

FOREIGN PATENT DOCUMENTS

WO83/00933 3/1983 PCT Int'l Appl. .
2133875 8/1984 United Kingdom .

OTHER PUBLICATIONS

Kash; "Picosecond Streak Camera with Single Photon Sensitivity"; IBM Tech. Disc. Bulletin; vol. 26, No. 12; May 1984; pp. 6604–6605.
Electronic Equipment News, vol. 16, No. 4, Nov. 1974; p. 61.

Primary Examiner—Edward P. Westin
Attorney, Agent, or Firm—Cushman, Darby & Cushman

[57] ABSTRACT

The photonic sampler device increases the dynamics of analysis of the transients by increasing the number of samples, and comprises a recording tube formed so as to receive a single optical channel at the input. Thus, the photocathode is of reduced size. In addition, the fluorescent screen is coupled to a single detector strip which has a high number of cells and whose longitudinal axis corresponds to the scanning direction. The magnification of the tube is determined so as to be adapted to the dimensions of the detector cells. The light amplification obtained may easily reach 250 and the number of samples may for example be 1728.

9 Claims, 4 Drawing Figures

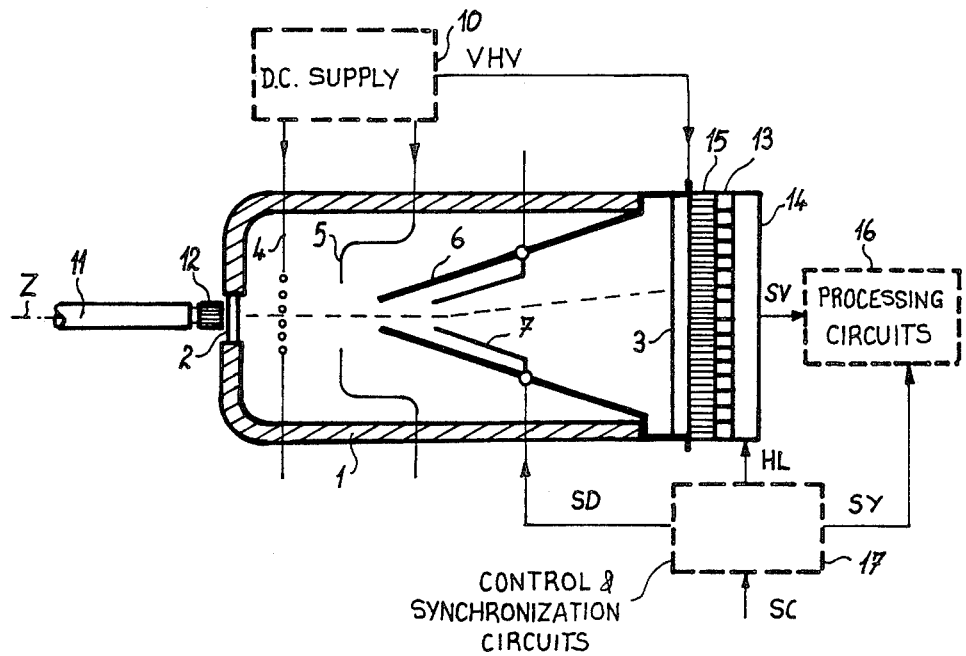
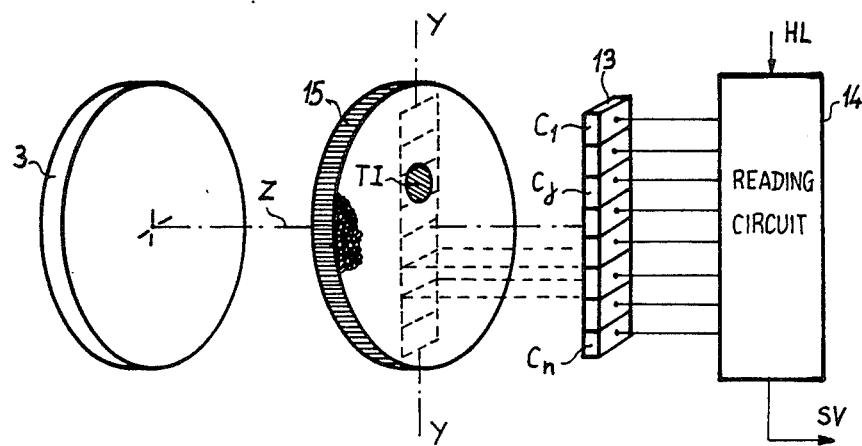

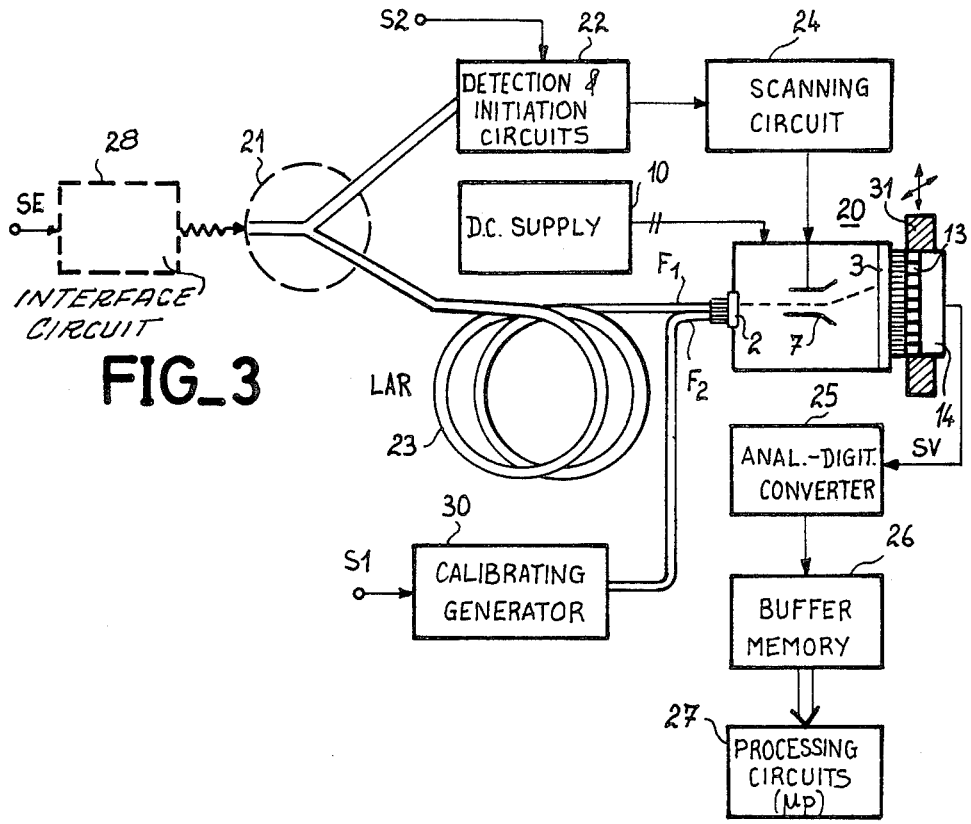
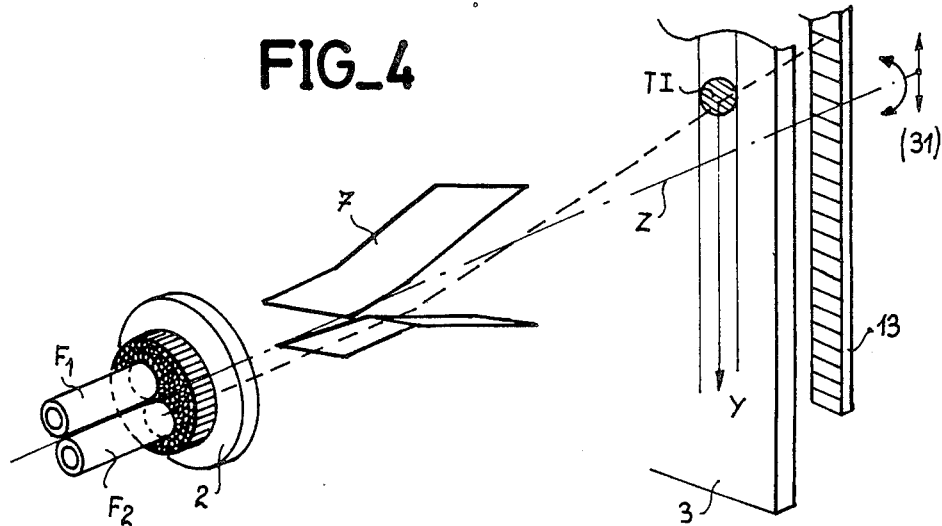

TRANSIENT ANALYSIS SYSTEM USING A PHOTONIC SAMPLER DEVICE

BACKGROUND OF THE INVENTION

1. Field of the Invention

The present invention relates to a photonic sampler device used in a system for analyzing optical or electric transients.

2. Description of the Prior Art

The recording of rapid transients over a large number of samples raises problems for sampling rates less than a nanosecond if it is intended to use only solid state circuits. Moreover, in this high frequency range a greater and greater percentage of signals are conveyed by optical fibers which signals therefore must be translated into electric signals, prior to recording, in receivers which are band limited.

The slit scanning camera, known as a streak camera is used for recording multiple optical signals whose resolution in time is less than a hundred or so picoseconds. The phenomenon to be observed, whether it is electrical or optical, is applied to an input interface circuit which facilitates calibrated optical signals. These optical signals are focused by a lens on a slit, the image of this slit being projected on the photocathode of the image converter tube by means of a take up lens. The optical signals may also be translated through a fiber bundle which ends on the camera side in a light slit represented by linearly juxtaposed fibers, and then are applied against the input window of an image converter tube. The streak camera comprises at the input a photocathode and at the output an anode formed by a fluorescent screen, and between the two grids are deflecting electrodes. Considering a number n of channels each corresponding to a fiber of the slit, at the input, n juxtaposed optical channels are available in a line and which, by deflection, will be moved vertically so as to display for each of these n channels the variation in time of the corresponding phenomenon.

At the output of the streak camera, the signal may be applied to a television camera if the gain is sufficient, this may be the case with a slit camera equipped with an image converter tube with incorporated microchannel pancake. If not, there is generally disposed between the streak camera and the television camera an image intensifying tube for increasing the light intensity of the signal and re-establishing a sufficient gain. The fluorescent screen of the streak camera is coupled optically to the input photocathode of the intensifier tube, such coupling being generally assumed by an optical fiber pancake. Similarly the output of the intensifier comprises a fluorescent screen, which is coupled by a fiber pancake to the television camera. This is preferably of solid state circuit type, such as a charge transfer device. It comprises an X, Y matrix of photosensitive elements which receive the light flux of the image at the output of the intensifier and this matrix is itself followed by preamplification and reading circuits for producing a video signal similar to that of television line by line scanning.

The advantage of the streak camera as an optical transient recorder is due to the substantially instantaneous transformation of the light into electrons at the photocathode and to the storage of the signal at the level of the screen, which allows it to be taken up by a video camera and to be digitized in deferred time. Another advantage is that amplification of the signal may be achieved with a very wide pass band.

However, systems using streak cameras capable of recording up to 50 channels generally, have a certain number of drawbacks likely to limit the fields of use thereof.

A first aspect to consider is that of reliability. It will be readily understood that if the streak camera breaks down, all the channels break down and it may be unacceptable to contemplate even a very low probability of losing the end measurements for a breakdown which affects this element of the chain.

If we now consider the dynamic aspects in time and in amplitude, the tube of the streak camera is designed for recording images and therefore it comprises relatively large photocathode and fluorescent screen surfaces which require fairly complex electronic optics while only allowing average spatial dynamics. Such dynamics are further reduced if the image is automatically taken up by means, for example, of a charge transfer device whose dimensions are small with respect to those of the fluorescent screen. The resolution of solid state cameras is limited at the present time to about $500 \times 500$ points and the possibility of recording in channels of $150 \times 200$ samples seems to be a maximum. It should be noted that the same analysis time is required for the different input channels and that all the channels are initiated at the same time.

In addition, the juxtaposition of the input channels causes the creation of cross talk defects corresponding to the overflow of light from one channel to the neighboring channel which further limits the response dynamics of the system. Finally, it should be noted that the defects of the chain include those of the complementary elements required between the streak camera and the solid state camera which are the light intensifier and a matching optical means between the fluorescent screen at the output of the intensifier and the solid state camera, this optical matcher being formed for example by an optical cone.

Another drawback results from the fact that the system with a streak camera requires, downstream of the solid state camera, the use of a relatively complex image memory for its operation.

SUMMARY OF THE INVENTION

The aim of the invention is to overcome the drawbacks mentioned above by providing a particular tube, derived from that of the streak camera but intended to sample only a single channel and in which, consequently, the photocathode may be reduced to a substantially pin point zone, the image on the fluorescent screen also forming a substantially pin point zone and the useful part of the screen corresponding substantially to a line in the deflection direction. This tube thus adapted may be readily coupled with a photoelectric detector device formed by a simple detecting strip whose direction corresponds to that of the time plot.

The invention provides a converter tube similar to that of a streak camera but with its cathode limited to the area required for receiving one or two optical fibers and comprising a photosensitive strip applied to the fluorescent screen. In such a tube the problems of geometrical distortion are overcome since scanning of the screen takes place solely along a diameter. By taking up the optical signal from a strip, amplitude dynamics may be obtained at least equal to if not greater than 500.

The deflection is determined so as to produce a magnification less than unity of the photocathode spot so that the spot transferred to the level of the strip is substantially of the same order of size as the elementary detecting cell. Finally, by limiting the dimensions of the tube to those which adapt the screen to the dimensions of the strip, a very compact assembly is obtained.

BRIEF DESCRIPTION OF THE DRAWINGS

The features and advantages of the present invention will be clear from the following description given by way of example with reference to the accompanying figures which show:

FIG. 1, a tube forming a photonic sampler device for forming a transient analysis system in accordance with the invention;

FIG. 2, a partial exploded view of the rear of the tube formed in accordance with FIG. 1;

FIG. 3, a diagram of the transient analysis system in accordance with the invention;

FIG. 4, a partial diagram of the tube using the same system shown in FIG. 3 for showing calibration arrangements.

DESCRIPTION OF THE PREFERRED EMBODIMENT

The photonic sampler device is shown in FIG. 1 to be formed by a tube coupled to a solid state circuit detector. The tube comprises, at the ends of a vacuum enclosure 1, an input cathode 2 for receiving light signals transmitted by optical fibers and at the output a fluorescent screen 3 for forming a light image with a given gain, the tube providing a light intensifying function. Inside enclosure 1 are disposed concentration and focusing grids 4 and 5, the anode 6 and the deflection electrodes 7. An associated power supply circuit 10 produces the high voltages applied to electrodes 4 and 5 and the very high voltage applied to anode 6.

The photocathode 2 of the tube is of reduced size, since it is intended to receive substantially only one optical channel to be processed for the analysis. The optical signals to be analyzed may be transmitted over an associated fiber 11 and the optical coupling to the photocathode may be obtained through a fiber pancake 12. The photocathode 2 is centered substantially along the axis Z of the tube and its dimensions are reduced since there is only a single optical input channel. In fact, the coupling for a second channel may be provided, as will be described below, for calibrating the tube before measurements. The tube is directly coupled by its fluorescent screen with a solid state circuit detector device which is formed of a detecting strip 13 and its associated amplification and reading circuit 14. Hereagain, the optical coupling between screen 3 and strip 13 may be suitably obtained by means of an optical fiber pancake 15.

FIG. 2 shows in an exploded view the positioning of these elements downstream of the fluorescent screen 3. The detecting strip 13 comprises a plurality n of elements or cells $C_1$ to $C_n$, for example, 1728 photosensitive elements with dimensions of $13 \times 39$ microns. The device thus allows a corresponding number of samples to be taken, the sampling being produced in space along the Y scan by the n elements of the strip.

The practical problems raised by the circuit are readily solved. A first problem is that of matching the light spot produced at the input, this spot generally having a diameter on the order of 100 microns, to the dimension of the output detector element $C_j$. The image TI produced on the element $C_j$ must then have dimensions substantially matching those of the element, for example on the order of 15 to 20 microns in the example considered. This is obtained by adjusting the positioning of the deflection electrodes 7 in the enclosure 1 during manufacture, such positioning causing the magnification of the tube to vary which, in the case considered, must be less than 1. A second practical problem is that of coupling strip 13 to the rear of the tube so as to center the light spot produced by scanning, due to the deflection, substantially along the axis of the strip. This operation may be undertaken at the outset by seeking maximum detection for a given signal.

Preferably, the tube will be calibrated before each significant set of measurements and a device is provided for adjusting the position of the strip with respect to the screen of the tube. This device may be adapted for moving strip 13 and its associated circuit 14 in directions perpendicular to X and Y or else for simply providing movement along Y and rotation about the axis Z of the tube.

The tube thus constructed provides image amplification with a gain which may be easily on the order of 10. In the example given, with reduction in magnification of the order of 1/5th, the light energy produced by the input signal is multiplied by the gain of the tube and at the output arrives on a surface about 25 times smaller. Consequently, the output brilliancy is 250 times higher than that presented by the input light spot on the photocathode 2. Compared with known systems of the streak camera type, again on the order of 10 may also be considered for these cameras; the optical device, such as a cone, for matching to the video camera introduces no gain and it is therefore generally necessary to insert a light intensifying stage at the output of the streak camera so as to obtain the desired brilliancy. The optical matching and light intensifying intermediate members used for producing an image adapted to the dimensions of the detecting target of the solid state circuit matrix form elements which degrade the signal and which are absent in the proposed circuit.

If we now compare the strip detector circuit having, for example, 1728 elements with that of a CCD circuit matrix which scarcely offers more than 500 points, it can be readily seen that 4 times more points (and so samples) are obtained. In addition, the reliability is high since now each channel becomes independent with the proposed design of an optical channel tube. Each independent channel may receive on the detection side a different command and may be started at a different time from the other channels. Another advantage comes from the fact that, downstream, in the processing circuits 16 for processing the detected video signal SV, there is no need to include an image memory. Furthermore, the cross talk problems no longer arise.

A photonic sampler tube such as that described and equipped with a strip of 1728 elements provides the following operating characteristics given for three sampling rates:

Sampling rate: 1 ns, 100 ps, 10 ps
Pass band: 500 MHz, 5 GHz, 50 GHz
Scanning time: 1.7 μs, 170 ns, 17 ns The circuit 17 shown in FIG. 1, is a control circuit which, on an external control signal SC coming, for example, from the operator, allows the system to be started up by applying deflection signals SD, ensures synchronization of circuit 14 by means of a reading clock HL and also transmits sync signals SY to the processing circuit 16. In the case where synchronization is provided from the processing circuits 16, circuit 17 will conversely provide the clock and deflection synchronization.

FIG. 3 shows a diagram of an optical transient analyzing system using a photonic sampling device 20 of the above described type. The system receives a signal input. In the case of an optical signal, it is applied directly to an optical coupler 21. In the case of an electric signal SE this signal is transformed previously in an interface circuit 28 into an optical signal by appropriate transducer means, for example a light emitting diode whose intensity is modulated by the electric input signal SE. The coupler 21 allows a small part of the optical signal to be taken off to a detection and initiation circuit 22, and for transmitting the remaining part of the optical signal to the photonic sampler device 20. This latter transmission takes place through an optical fiber 23 which forms a delay line and which allows the delay and initiation to be compensated for. The initiation circuit 22 receives an initiation signal S2 and may comprise an optical receiver followed by a threshold initiator. The output of the threshold comparator is applied to the scanning circuit 24 for controlling this generator and producing the corresponding deflection signals applied to the electrodes 7 of the tube.

The circuit shown comprises a single sampler tube and only relates to the processing of a single channel; for several channels there are other photonic sampler tubes and the scanning circuit 24 and power supply 10 circuits may possibly be common to several tubes. The detected video output signal SV is first of all digitized analog/digital converter 25 then transferred through a buffer memory 26 to processing circuits 27 which may comprise a microprocessor assembly.

In the analyzing system, a calibrating generator 30 can be used prior to the measurement, for calibrating the device upon application of an external control signal S1. The optical output of the calibration generator is transmitted through a fiber to the input of the sampler tube which comprises two optical incoming fibers, the output fiber of the delay line 23 in normal operation and the output fiber of the generator during the calibration phase. The mechanical device 31 is provided for positioning the detector strip so as to cause its longitudinal axis to coincide substantially with that Y of the light plot due to the deflection of the calibration signal. The two input fibers are of course placed side by side one below the other and in a direction corresponding to the scanning direction Y.

FIG. 4 shows in greater detail the input arrangement and the vertical direction Y of scanning on the screen 3. Device 31 allows the strip to be moved in translation along its axis and by rotation about a direction parallel to axis Z so that its longitudinal axis coincides substantially with that Y of the light plot produced by scanning the instantaneous image TI of the optical calibration signal applied to the input of the tube by the fiber F2, and so that the light plot is recovered.

If need be an optical attenuator with given or adjustable attenuation may be disposed at the input between the ends of fibers F1 and F2 and the photocathode 2 of the tube.

It is also possible to insert between screen 3 of the tube and the photodetector strip 13 an optical attenuator comprising a plurality of attenuation zones each of a predetermined value so as to obtain, from a constant light flux applied to the input of the tube, a detected rapid electric signal of desired form and amplitude which may serve as a signal for simulating, for example, an exponential signal. In this mode of application of the tube, the number of attenuation zones corresponds preferably to the number n of detector elements and the position and area of these zones are determined by coupling each zone with a detector element; on the input side an associated continuous light source is provided whose flux is conveyed to the input of the tube by the input interface.

The analysis system described offers multiple advantages in comparison with known systems such as those used in a streak camera. Besides the advantages already mentioned, due to the sampler tube, it should also be noted that it is less expensive than these known systems, that it allows a larger number of instantaneous bits to be processed, for example 12 bits instead of 8 to 9 bits, that it has much higher dynamics and that it does not require a complex image memory before processing, since the information is applied directly through buffer memory 26 to processing circuits 27, which will advantageously comprise a microprocessor unit with its associated memories.

What is claimed is:

1. A transient analysis system comprising:
   photonic sampler means including a tube having a vacuum enclosure and input and output ends, said input end including a photocathode for receiving light signals to be analyzed and for transforming the light signals into an electron beam, said output end including a fluorescent screen and said vacuum enclosure containing deflection electrodes provided for deflecting the electron beam received from said photocathode in a predetermined direction thereby producing a light plot of transient phenomena resulting from the deflected electron beam striking said fluorescent screen, said photonic sampler means providing light intensification of a predetermined gain by said tube being optically coupled on the input end to a single optical analysis channel allowing said photocathode to be of reduced dimensions for receiving the light plot corresponding to the optical signal to be processed; and
   image detector means including a solid state detector strip optically coupled to said fluorescent screen of said photonic sampler means, said detector strip being disposed parallel to the deflection direction and centered substantially along a diameter of said tube which corresponds to the light plot scanning range caused by the electron beam deflection.

2. The system as claimed in claim 1, wherein said detector strip is a charge transfer device including amplification and reading circuits delivering a video output directly.

3. The system as claimed in claim 1, wherein said optical couplings are provided by a first pancake of optical fibers on the photocathode side for receiving said light signals and by a second pancake of optical fibers on the fluorescent screen side providing optical coupling between the fluorescent screen and the strip.

4. The system as claimed in claim 2, further comprising means for adjusting the position of the strip in a plane parallel to the fluorescent screen so as to give it a direction centered substantially on that of the light plot scanning range and so that it covers the light plot.

5. The system as claimed in claim 4, further comprising an optical directional coupler for diverting a small part of the input light energy; detection and initiation means for receiving said diverted input light energy, the remaining part of said input light energy being applied to the photocathode through an optical fiber line used as a delay line for compensating for the delay of the detection and initiation means, said detection and initiation means receiving an initiation control signal and comprising a threshold detector and scanning circuit means controlled by the threshold detector for controlling the scanning of the tube; an analog-digital converter for receiving the video output; and a buffer memory means for transferring the video output digitized data output from said analog-digital converter to a processing circuit.

6. The system as claimed in claim 5, further comprising a calibration generator means for receiving a control signal and for delivering an optical signal transmitted by a second optical fiber to the photocathode input end of the tube, said input end of the tube comprising two superimposed optical fibers one corresponding to one end of the delay line and the other to the output of the calibration generator, said fibers being superimposed in the scanning direction, said means for adjusting the position of the strip allowing a value of the detected calibration signal to be optimized.

7. The system as claimed in any one of claims 2, 4, 5, and 6, comprising an optical attenuator device disposed at the input end of the tube upstream of the photocathode.

8. The system as claimed in any one of claims 2, 4, 5 and 6, comprising an optical attenuator device disposed between the fluorescent screen of the tube and the detector strip, said attenuator device comprising a plurality of predetermined respective attenuation zones associated with photodetecting elements of the detector strip so as to produce, from a constant light flux at the input end of the tube, a rapid detected signal of desired form and amplitude.

9. The system as claimed in claim 8, wherein the number of attenuation zones is equal to the number n of photodetector elements and their position and dimensions are determined so as to associate them respectively with the n detector elements.

* * * * *